(12) United States Patent
Tomomatsu et al.

(10) Patent No.: US 11,355,597 B2
(45) Date of Patent: Jun. 7, 2022

(54) TRANSISTOR WITH SOURCE FIELD PLATES AND NON-OVERLAPPING GATE RUNNER LAYERS

(71) Applicant: TEXAS INSTRUMENTS INCORPORATED, Dallas, TX (US)

(72) Inventors: Hiroyuki Tomomatsu, Dallas, TX (US); Sameer Pendharkar, Allen, TX (US); Hiroshi Yamasaki, Aizuwakamatsu (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/153,976

(22) Filed: Jan. 21, 2021

(65) Prior Publication Data
US 2021/0143258 A1    May 13, 2021

Related U.S. Application Data

(63) Continuation of application No. 16/383,857, filed on Apr. 15, 2019, now Pat. No. 10,903,320, which is a continuation of application No. 15/415,995, filed on Jan. 26, 2017, now Pat. No. 10,263,085.

(60) Provisional application No. 62/440,771, filed on Dec. 30, 2016.

(51) Int. Cl.
| | |
|---|---|
| *H01L 23/48* | (2006.01) |
| *H01L 29/40* | (2006.01) |
| *H01L 29/778* | (2006.01) |
| *H01L 29/423* | (2006.01) |
| *H01L 23/482* | (2006.01) |
| *H01L 29/20* | (2006.01) |

(52) U.S. Cl.
CPC ........ *H01L 29/404* (2013.01); *H01L 23/4824* (2013.01); *H01L 29/4238* (2013.01); *H01L 29/7786* (2013.01); *H01L 29/2003* (2013.01)

(58) Field of Classification Search
CPC .............. H01L 23/4824; H01L 29/404; H01L 29/2003; H01L 29/4238; H01L 29/7786
USPC ......................................................... 257/76
See application file for complete search history.

(56) References Cited

U.S. PATENT DOCUMENTS

| | | | | |
|---|---|---|---|---|
| 9,722,063 | B1 * | 8/2017 | Kudymov | H01L 29/66462 |
| 10,263,085 | B2 * | 4/2019 | Tomomatsu | H01L 23/4824 |
| 11,075,294 | B2 * | 7/2021 | Kudymov | H01L 21/0217 |
| 2013/0075925 | A1 | 3/2013 | Iwabuchi et al. | |
| 2015/0270379 | A1 * | 9/2015 | Kuraguchi | H01L 29/7786 257/194 |

(Continued)

*Primary Examiner* — Didarul A Mazumder
(74) *Attorney, Agent, or Firm* — Andrew R. Ralston; Charles A. Brill; Frank D. Cimino (57) ABSTRACT

A transistor device includes a field plate that extends from a source runner layer and/or a source contact layer. The field plate can be coplanar with and/or below a gate runner layer. The gate runner layer is routed away from a region directly above the gate metal layer by a gate bridge, such that the field plate can extend directly above the gate metal layer without being interfered by the gate runner layer. Coplanar with the source runner layer or the source contact layer, the field plate is positioned close to the channel region, which helps reduce its parasitic capacitance. By vertically overlapping the metal gate layer and the field plate, the disclosed HEMT device may achieve significant size efficiency without additional routings.

19 Claims, 7 Drawing Sheets

(56) References Cited

U.S. PATENT DOCUMENTS

2017/0271329 A1* 9/2017 Farrell ............... H01L 23/4824

* cited by examiner

TRANSISTOR WITH SOURCE FIELD PLATES AND NON-OVERLAPPING GATE RUNNER LAYERS

CROSS-REFERENCE TO RELATED APPLICATIONS

Under 35 U.S.C. § 119(e), this nonprovisional application claims benefits of and priority to U.S. Provisional Patent Application No. 62/440,771, filed on Dec. 30, 2016, the entirety of which are hereby incorporated herein by reference. This application is a continuation of U.S. patent Ser. No. 16/383,857, which is a continuation of U.S. patent application Ser. No. 15/415,995, each of which is incorporated by reference in its entirety.

BACKGROUND

High-voltage transistors, such as a high electron mobility transistor (HEMT), have wide industrial applications in high-voltage and fast switching operations. A gallium nitride (GaN) transistor is a type of HEMT device, which can withstand high drain-to-source voltage (e.g., greater than 100 V) and provide fast switching speed. In general, a GaN transistor includes a drain region, a source region, a channel region, and a gate structure positioned above the channel region. For high speed switching, a GaN transistor may also include a field plate above the gate structure. The placement of the field plate may impact the design of the gate structure, which in turn presents several trade-offs between the performance and the size of a GaN transistor.

SUMMARY

The present disclosure provides a solution to enhance the performance of one or more HEMT devices without significantly increasing the size thereof. The disclosed solution simultaneously reduces the resistance of the gate structure and the parasitic capacitance associated with the field plate of a HEMT device, while avoiding additional routings. In one implementation, for instance, an HEMT device includes a field plate extending from a source runner layer and/or a source contact layer. The field plate can be coplanar with and/or below a gate runner layer. The gate runner layer is routed away from a region directly above the gate metal layer by a gate bridge, such that the field plate can extend directly above the gate metal layer without being interfered by the gate runner layer. Coplanar with the source runner layer or the source contact layer, the field plate is positioned close to the channel region, which helps reduce its parasitic capacitance. By vertically overlapping the metal gate layer and the field plate, the disclosed HEMT device may achieve significant size efficiency without additional routings.

Like reference symbols in the various drawings indicate like elements. Details of one or more implementations of the present disclosure are set forth in the accompanying drawings and the description below. The figures are not drawn to scale and they are provided merely to illustrate the disclosure. Specific details, relationships, and methods are set forth to provide an understanding of the disclosure. Other features and advantages may be apparent from the description and drawings, and from the claims.

DETAILED DESCRIPTION

Figure 1:
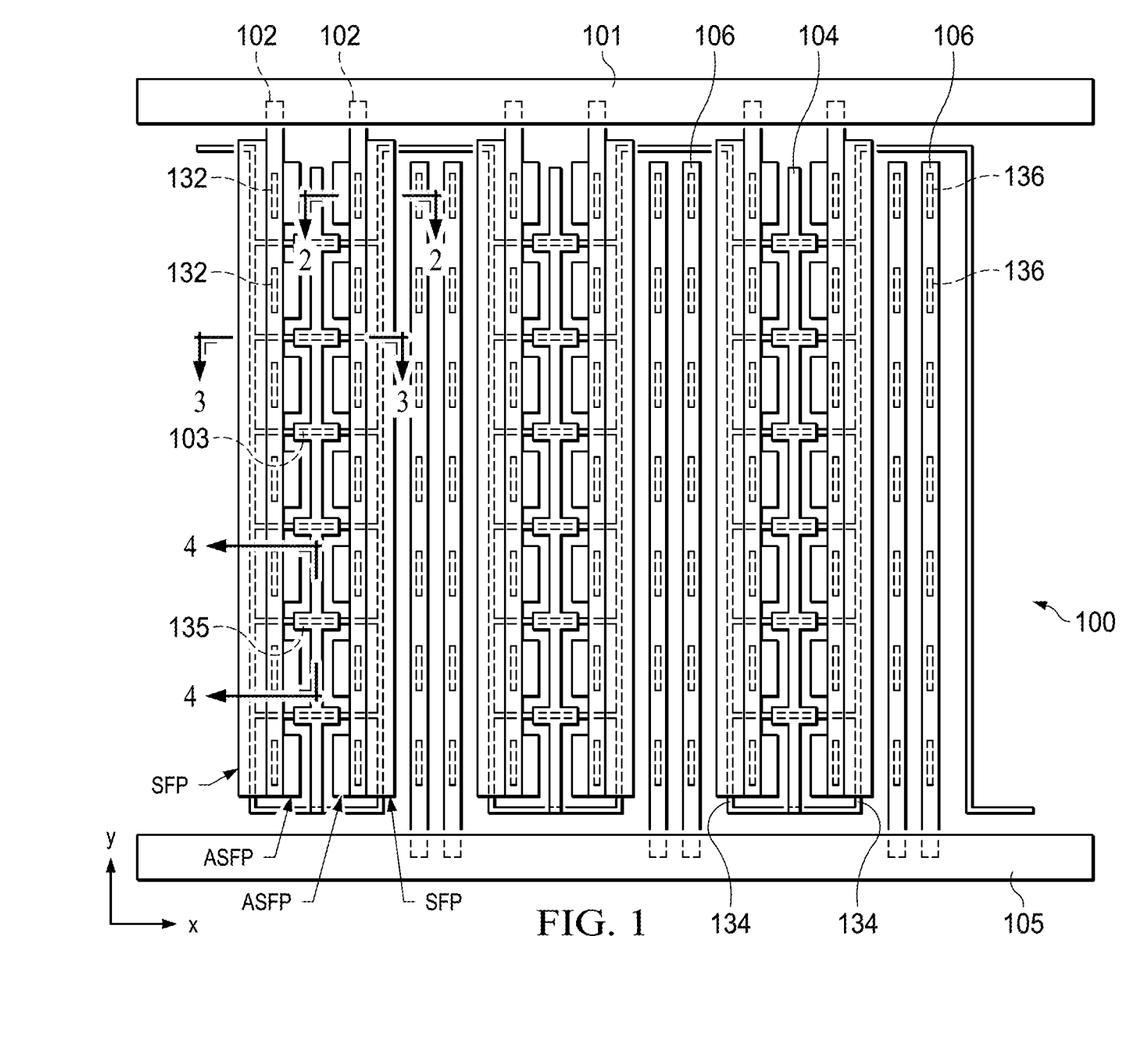
FIG. 1 shows a top layout view of a transistor device according to an aspect of the present disclosure.

FIG. 1 shows a top layout view of a transistor device 100 according to an aspect of the present disclosure. The transistor device 100 may be a standalone discrete device fabricated on a single semiconductor die. Alternatively, the transistor device 100 may be incorporated to one or more circuits fabricated on a single integrated circuit die. The transistor device 100 as shown in FIG. 1 may include additional layers above and below the labeled components. But for the clear illustration of the labeled components therein, these additional layers are not shown in FIG. 1.

The transistor device 100 includes a lower metal layer (see, e.g., structure 130 in FIG. 2) that includes a source contact layer 132 and a drain contact layer 136. The source contact layer 132 includes multiple source contacts that establish ohmic contacts with a source region (e.g., structure 122 in FIG. 2) of the transistor device 100. The drain contact layer 136 includes multiple drain contacts that establish ohmic contacts with a drain region (e.g., structure 126 in FIG. 2) of the transistor device 100. The transistor device 100 also includes a gate metal layer (or simply "gate layer") 134 that includes multiple gate fingers connected to form a serpentine structure that interposed between the multiple drain contacts and source contacts. In one configuration, the gate layer 134 is positioned closer to the source contacts of the source contact layer 132 than the drain contacts of the drain contact layer 136. Above a channel region (e.g., structure 124 in FIG. 2), the multiple gate fingers (of the gate layer 134) coextend in parallel along a dimension y. As disclosed herein, the dimension y can be referenced by a channel width direction of the channel region. The gate layer 134 also includes one or more gate bridges 135, each of which is positioned away from the channel region and across the source contacts of the source contact layer 132. The gate bridges 135 extend from, and thereby connecting, two adjacent gate fingers of the gate layer 134 to form a ladder structure. In one implementation, for example, the gate bridges 135 may connect two adjacent gate fingers of the gate layer 134 at an interval ranges from 25 μm to 50 μm.

Above the lower metal layer, the transistor device 100 includes a middle metal layer (see, e.g., structure 140 in FIG. 2) that includes a source runner layer 102, a gate runner layer 104, and a drain runner layer 106. The source runner layer 102 includes multiple source runner fingers, and the drain runner layer 106 includes multiple drain runner fingers interleaving with the source runner fingers. As such, the source runner layer 102 and the drain runner layer 106 coextends in parallel and along the dimension y. The gate runner layer 104 includes multiple gate runner fingers, each of which is interposed between two adjacent source fingers from the source runner layer 102. The gate runner fingers of the gate runner layer 104 coextends along the direction y and thus, are in parallel with, the source runner fingers of the source runner layer 102. The gate runner layer 104 also includes gate runner bridges 103 along a dimension x of the channel region. As disclosed herein, the dimension x may be referenced by a channel length direction of the channel region (see, e.g., structure 124 in FIG. 2). The gate runner bridges 103 are structured and positioned to make ohmic contacts with the underlying gate bridges 135. Although the gate runner fingers of the gate runner layer 104 are positioned away from, and thus do not vertically overlap, the gate fingers of the gate layer 134; the gate runner layer 104 is coupled to the gate layer 134 via the gate runner bridges 103 and the gate bridges 135.

Figure 7:
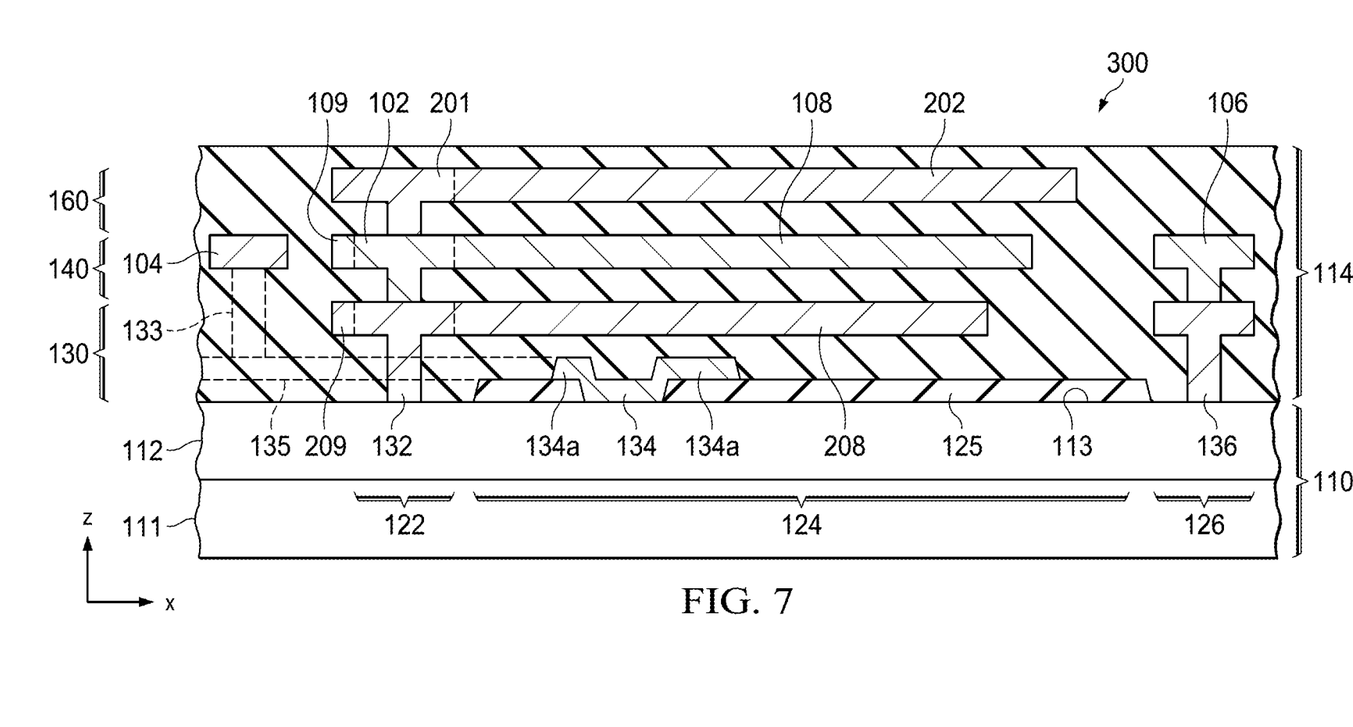
FIG. 7 shows a cross-sectional view of a third transistor device along an x-z plane according to an aspect of the present disclosure.

Above the middle metal layer, the transistor device 100 includes an upper metal layer (see, e.g., structure 160 in FIG. 7). The upper metal layer includes a source terminal conductor 101 and a drain terminal conductor 105. The source terminal conductor 101 extends along the dimension x, and it is connected to the source fingers of the source runner layer 102. Likewise, the drain terminal conductor 105 extends along the dimension x, and it is connected to the drain fingers of the drain runner layer 106. Generally, the dimension x deviates from the dimension y. In one configuration, for example, the dimension x may be perpendicular to the dimension y. And in this particular configuration, the source terminal conductor 101 is perpendicular to the source fingers of the source runner layer 102, whereas the drain terminal conductor 105 is perpendicular to the drain fingers of the drain runner layer 106.

Figure 2:
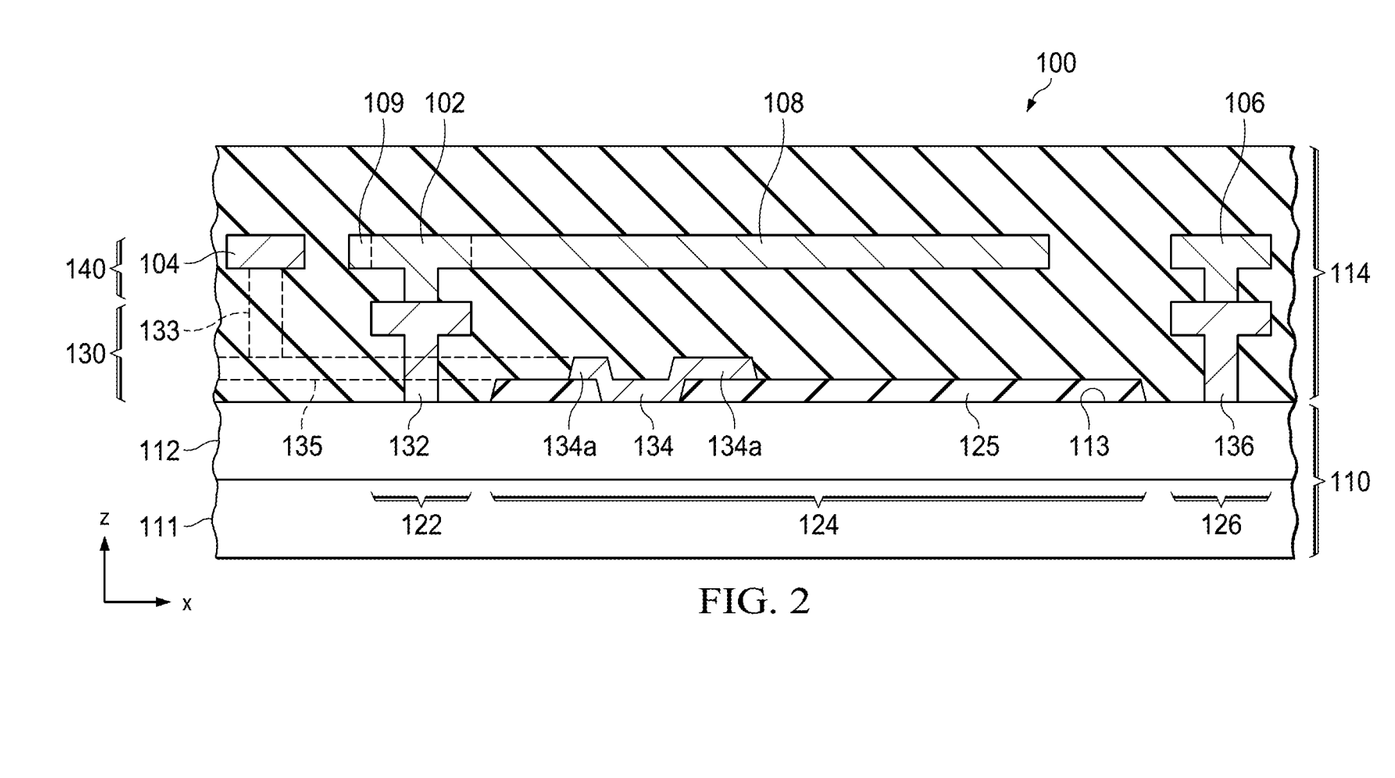
FIG. 2 shows a first cross-sectional view of the transistor device along an x-z plane according to an aspect of the present disclosure.
Figure 3:
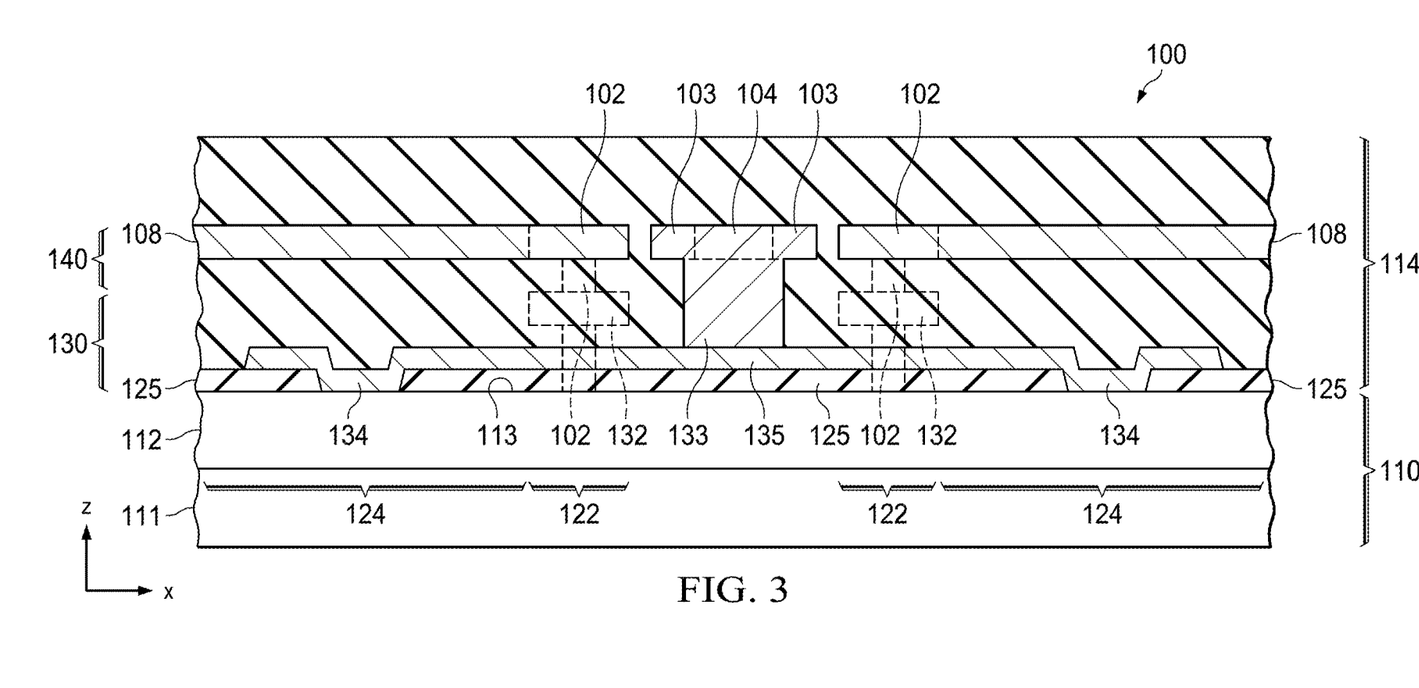
FIG. 3 shows a second cross-sectional view of the transistor device along another x-z plane according to an aspect of the present disclosure.
Figure 4:
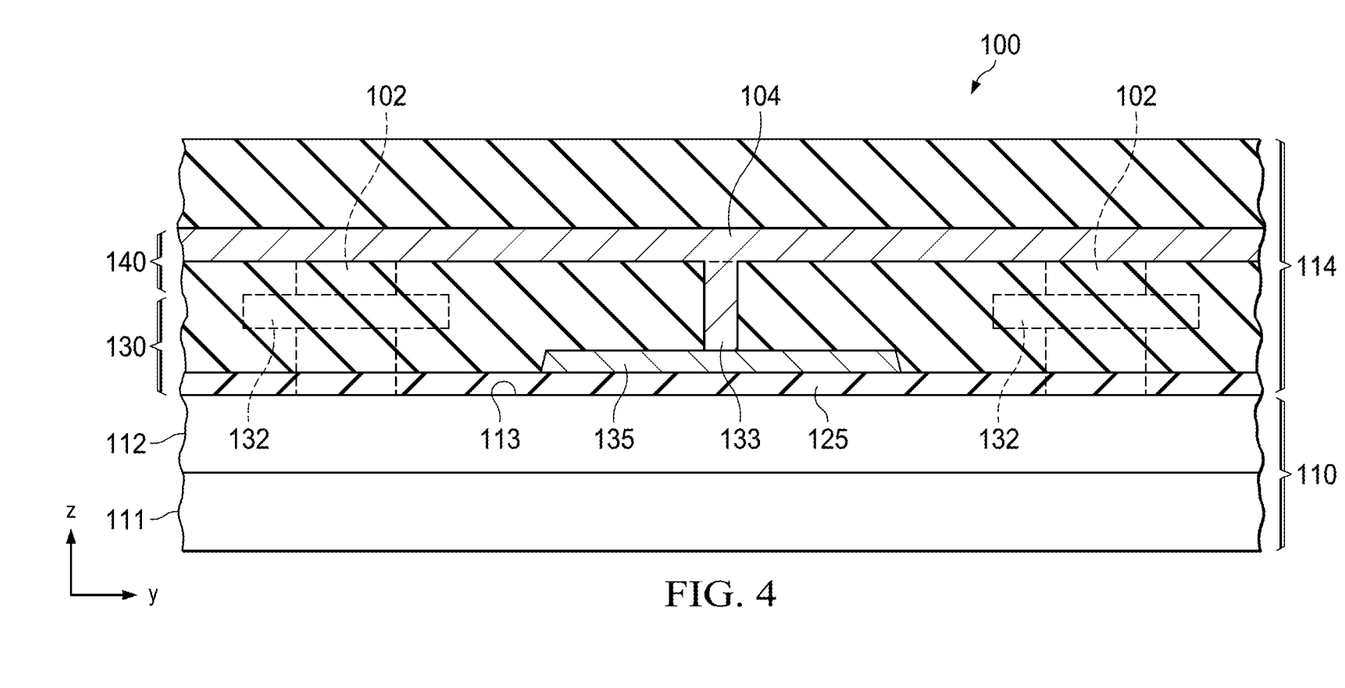
FIG. 4 shows a cross-sectional view of the transistor device along a y-z plane according to an aspect of the present disclosure.
Figure 5:
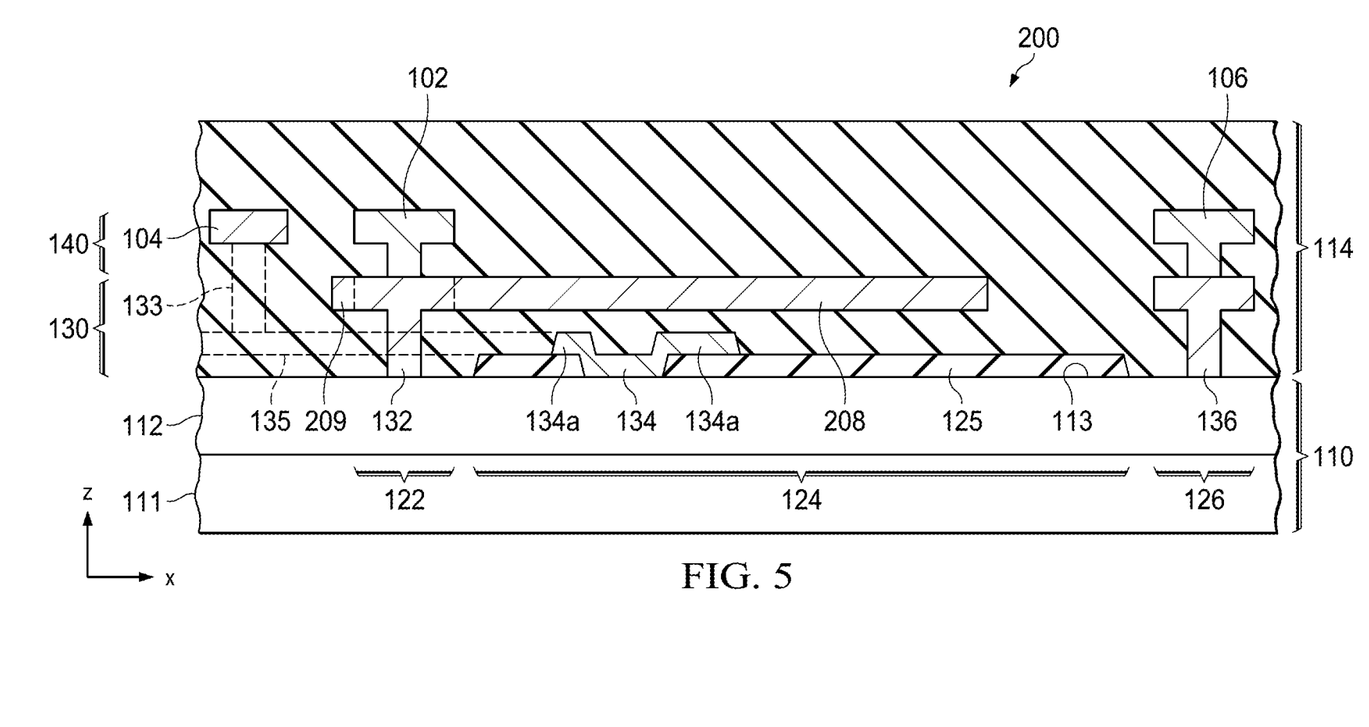
FIG. 5 shows a first cross-sectional view of a second transistor device along an x-z plane according to an aspect of the present disclosure.
Figure 6:
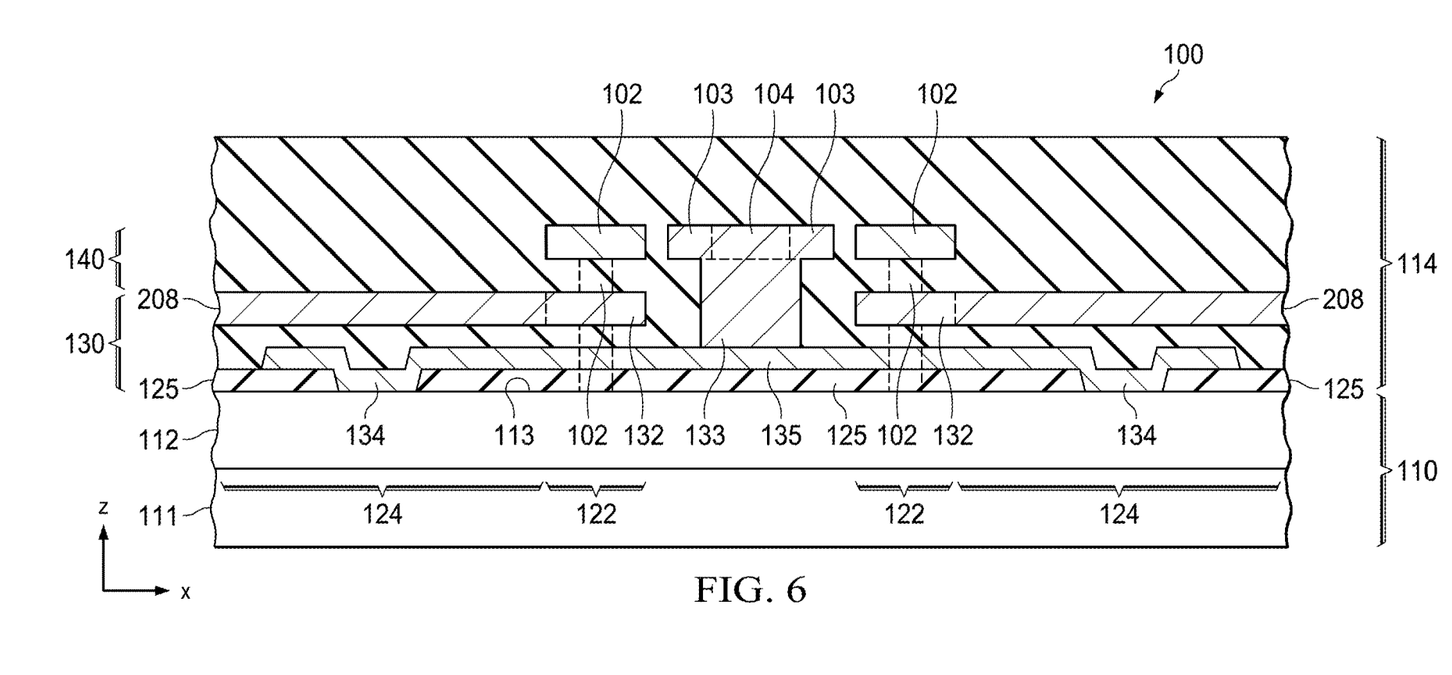
FIG. 6 shows a second cross-sectional view of the second transistor device along another x-z plane according to an aspect of the present disclosure.

For fast switching, the transistor device 100 includes one or more source field plates (SFP) and optionally one or more auxiliary source field plates (ASFP). While the SFP extends towards the channel region, the ASFP extends away from the channel region. In one example configuration where the source contact layer 132 is less than a vertical distance (e.g., 1 μm) above the gate layer 134, the SFP and ASFP may extend indirectly from the source contact layer 132 via the source runner layer 102. Being coplanar with the source runner layer 102, the SFP and the ASP are positioned above the source contact layer 132, and they may have a lower resistivity than the source contact layer 132. FIGS. 2-4 show various cross-sectional views of this example configuration. In another example configuration where the source contact layer 132 is more than a vertical distance (e.g., 1 μm) above the gate layer 134, the SFP and ASFP may extend directly from the source contact layer 132. Being coplanar with the source contact layer 132, the SFP and the ASFP are positioned below the gate runner layer 104, and they have a higher resistivity than the gate runner layer 104. FIGS. 5-6 shows the cross-sectional views of this example configuration.

FIG. 2 shows a first cross-sectional view of the transistor device 100 along an x-z plane according to an aspect of the present disclosure. As disclosed herein, the dimension z may be referenced by a device thickness of a semiconductor die incorporating the transistor device 100. Accordingly, the transistor device 100 includes multiple layers along a dimension z and multiple layout regions along a plane (an "x-y plane") defined by the dimension y and the dimension x. More particularly, the transistor device 100 includes a semiconductor substrate 110 and a dielectric layer 114 positioned on the semiconductor substrate. Along the dimension z, the semiconductor substrate 110 may include a first semiconductor layer 111 and a second semiconductor layer 112. The first semiconductor layer 111 may be a first gallium nitride (GaN) layer, which includes a first GaN material. The second semiconductor layer 112 may be a second GaN layer, which includes a second GaN material such as aluminum gallium nitride (AlGaN). Along the x-y plane and a top surface 113 of the semiconductor layer 110, the transistor device 100 includes a source region 122, a drain region 126, and a channel region 124. The channel region 124 has a first end and a second end being positioned between the source region 122 and the drain region 126 respectively.

Above the semiconductor substrate 110 and within the dielectric layer 114, the transistor device 100 includes a first metal layer 130. The first metal layer 130 includes a conductive material, such that the first metal layer 130 may be used as a contact layer for establishing ohmic contacts with various regions of the semiconductor substrate 110. In one implementation, the first metal layer 130 may include an alloy layer and an interface layer positioned on the alloy layer. In one implementation, for example, the alloy layer comprises titanium (Ti), aluminum (Al), and copper (Cu), whereas the interface layer comprises a nitride material, such as titanium nitride (TiN). The first metal layer 130 may be used for forming a source contact layer 132 and a drain contact layer 136. The source contact layer 132 makes ohmic contact with the source region 122, whereas the drain contact layer 136 makes ohmic contact with the drain region 126.

The transistor device 100 includes a gate metal layer 134 contacting the channel region 124. The gate metal layer 134 is positioned between the source contact layer 132 and the drain contact layer 136. In one implementation, the gate metal layer 134 is positioned closer to the source contact layer 132 than the drain contact layer 136. A gate dielectric layer 125 surrounds the gate metal layer 134, and thus it shields the gate metal layer 134 from the source contact layer 132 and the drain contact layer 136. In one implementation, for example, the gate dielectric layer 125 may include a nitride material, such as silicon nitride. The transistor device 100 includes a pair of gate field plates 134a extending laterally and above the gate metal layer 134. The gate field plates 134a are insulated from the channel region 124 by the gate dielectric layer 125. The gate metal layer 134 and the gate field plates 134a each includes a barrier metal layer and an interface layer on the barrier metal layer. In one implementation, the gate metal layer 134 may include silver (Au) and/or platinum (Pt) as these materials provide low gate resistance (Rgate). However, silver and platinum are expensive and relatively thick, and they may present stress issue and integration issue during the fabrication process. To reduce the thickness of the gate structure, the gate metal structure 123 may include a material with slightly higher resistance but is relatively resilient against fabrication stress. For example, the barrier metal layer of the gate metal layer 134 may include a titanium tungsten (TiW) material, whereas the interface layer of the gate metal layer 134 may include a titanium nitride (TiN) material.

In general, low gate resistance (Rgate) improves the switching speed of the transistor device 100. One way to reduce the gate resistance is by reducing the length of each gate finger (as shown and described in FIG. 1A) and by increasing the number of gate fingers. Such a gate resistance reduction scheme involves similar reconfigurations for the source fingers and the drain fingers as well. As a result, additional area may be needed for additional routings, which will increase the size of the transistor device 100.

Another way to reduce the gate resistance is by applying a layer of runner metal layer, which has lower resistivity than the underlying metal layer (e.g., 130 and 123). In one implementation, for example, the transistor device 100 includes the gate runner layer 104 to reduce the overall gate resistance (Rgate) contributed by the gate metal layer 134. The gate runner layer 104 is a part of a second metal layer 140, which has a lower resistivity than the gate metal layer 134 and the first metal layer 130. In one implementation, for example, the second metal layer 104 may include an aluminum (Al) material. In another implementation, for example, the second metal layer 140 may include a lead (Pb) material.

In addition to the gate runner layer 104, the second metal layer 104 also encompasses the source runner layer 102 and the drain runner layer 106. Like the gate runner layer 104, the source runner layer 102 and the drain runner layer 106 each serves to reduce the overall resistance of the source contact layer 132 and the drain contact layer 136 respectively. More particularly, the source runner layer 102 and the drain runner layer 106 each makes ohmic contact with the respective source contact layer 132 and the respective drain contact layer 136 at predetermined intervals. The spatial and structural relationships among the source runner layer 102, the gate runner layer 104, and the drain runner layer 106 as shown in FIGS. 2-4 are consistent with the illustration and description of FIG. 1. Moreover, the source runner layer 102, the gate runner layer 104, and the drain runner layer 106 are substantially coplanar along the x-y plane as shown in FIG. 2. For instance, these runner layers 102, 104, and 106 are formed during the same process steps such that they are aligned along the same process plane level with slight shifts introduced by process variations of their respective underlying layers.

For high speed switching, the transistor device 100 includes a field plate to be positioned near the channel region 124. Where the field plate is coupled to the source region 122, the gate-to-drain parasitic capacitance ($C_{gd}$) and the gate-to-gate parasitic capacitance ($C_{gg}$) can be minimized. Thus, the transistor device 100 may adopt a source field plate configuration. To allow a source field plate to be positioned near the channel region 124, the first metal layer 130 and/or the second metal layer 140 may be used for forming the source field plate. In the configuration as depicted in FIGS. 2-4, where the source contact layer 132 is less than a vertical distance (e.g., 1 μm) above the gate layer 134, the transistor device 100 includes a source field plate (SFP) 108 and an auxiliary source field plate (ASFP) 109 that extend indirectly from the source contact layer 132. More specifically, the SFP 108 may extend directly from the source runner layer 102, which is coupled to and extended from the source contact layer 132. Diverging from the source runner layer 102, the SFP 108 extends along the dimension x of the channel region 124 and over the gate metal layer 134.

Because the SFP 108 extends from and source runner layer 102, the SFP 108 has the same resistivity as the source runner layer 102, which is typically lower than the gate metal layer 134 and the first metal layer 130 (e.g., the contact layers 102 and 106). Moreover, the SFP 108 is substantially coplanar with the source runner layer 102, the gate runner layer 104 and the drain runner layer 106. For instance, the SFP 108 and the runner layers 102, 104 and 106 are formed during the same process steps such that they are aligned along the same process plane level with slight shifts introduced by process variations of their respective underlying layers. Along the dimension z, the SFP 108 is positioned above the gate metal layer 134 and the first metal layer 130. Moreover, the SFP 108 is separated from the gate metal layer 134, the gate field plate 134a, and the gate runner layer 104 by an insulating layer, which can be the dielectric layer 114. The ASFP 109 shares similar geometric properties as the SFP 108 except that the ASFP 109 extends along a direction opposite to the SFP 108. More specifically, the ASFP 109 extends away from the channel region 124 while the SFP 108 extends to at least partially cover the channel region 124.

To avoid shorting or otherwise interfering with the SFP 108, the gate runner layer 104 is routed away from a region directly above the gate metal layer (or simply "gate layer") 130. The dotted structures 133 and 135 are part of this routing configuration, which are not present in the cross-sectional view along the x-z plane as shown in FIG. 2. Instead, the dotted structure 133 and 135 are present in another cross-section along another x-z plane that is parallel to the one as shown in FIG. 2. For instance, FIG. 3 shows a second cross-sectional view along the x-z plane of the transistor device 100. The gate runner layer 104 is routed directly above a region that is positioned between two adjacent source runner layers 102. To facilitate this routing configuration, the transistor device 100 includes a gate bridge 135 that extends from the gate layer 134 along the dimension x. Coplanar with the gate field plate 134a, the gate bridge 135 is insulated from the top surface 113 by the gate dielectric layer 125.

The gate bridge 135 traverses across a space between two adjacent source contacts of the source contact layer 132, in which the two adjacent source contacts are aligned in the dimension y. The source contact layer 132 is illustrated with dotted outline because it is not present in the cross-section along the x-z plane as shown in FIG. 3. As such, the gate bridge 135 extends under the source runner layer 102 but without contacting the source contact layer 132. And being so positioned, the source contacts of the source contact layer 132 is interposed between the gate layer 134 and the gate runner layer 104 along the dimension x.

The gate bridge 135 provides an electrical coupling between the gate runner layer 104 and the gate layer 134. Being positioned along a lower metal layer than the gate runner layer 104, the gate bridge 135 and the gate layer 134 share a common metal layer that has a higher resistivity than the gate runner layer 104. For reducing the resistance of this electrical coupling, the transistor device 100 may include a gate runner bridge 103 in the gate runner layer 104. The gate runner bridge 103 widen the gate contact 133 for increasing a contact area between the gate runner layer 104 and the gate bridge 135. In one implementation, the gate contact 133 may include the same material as the second metal layer 140. In another implementation the gate contact 133 may include a first layer and a second layer on top of the first layer. The first layer of the gate contact 133 includes the same material as the first metal layer 130, whereas the second layer of the gate contact 133 includes the same material as the second metal layer 140.

FIG. 4 shows a cross-sectional view of the transistor device 100 along a y-z plane, which is perpendicular to the x-z planes as shown in FIGS. 2 and 3. The gate runner layer 104 coextend with the source runner layer 102 and the SFP 108 (as well as the ASFP 109) along the dimension y, which can be referenced as the channel width dimension if the channel region 124. The gate runner layer 104 is positioned above and between two adjacent source contacts of the source contact layer 132, which are illustrated with dotted outlines because they are not present in the y-z plane as shown in FIG. 4.

By means of routing the gate runner layer 104 away from a region directly above the gate layer 134, the SFP 108 may be placed at a relatively close distance (e.g., less than 5 µm) from the channel region 124. The low placement of the SFP 108 is advantageous for several reasons. First, the low placement allows the SFP 108 to be formed alongside with the source runner layer 102, which reduces the vertical size of the transistor device 100. Second, the low placement of the SFP 108 helps reduce process complexity. Third, the low placement of the SFP 108 maximizes its effectiveness when compared to field plates with higher placements (e.g., metal layers above the second metal layer 140), which is distanced farther away from the channel region 124.

While FIGS. 2-4 show that the SFP 108 extends directly from the source runner layer 102, another SFP may extend directly from the source contact layer 132 where the source contact layer 132 is more than a vertical distance (e.g., 1 µm) above the gate layer 134. As shown in FIGS. 5-6, for example, a transistor device 200 may include a source field plate (SFP) 208 and an auxiliary source field plate (ASFP) 209 that extend directly from the source contact layer 132. Being coplanar with the source contact layer 132, the SFP 208 and the ASFP 209 are positioned below the second metal layer 140, and they typically have a higher resistivity than the second metal layer 140, such as the gate runner layer 104.

FIG. 5 illustrates the same cross-section along the first x-z plane as shown in FIG. 2 but with reference to the transistor device 200 instead of the transistor device 100. Likewise, FIG. 6 illustrates the same cross-section along the second x-z plane as sown in FIG. 3 but with reference to the transistor device 200 instead of the transistor device 100. The transistor device 200 is similar to the transistor device 100 in that these two devices include components with the same numeric references among FIGS. 2-4 and 5-6. As such, the transistor device 200 has the same structural and functional characteristics as the transistor device 100 with respect to these components. For instance, the transistor device 200 includes the same gate bridge 135 and the same gate runner layer 104 as in the transistor device 100. Regarding transistor device 200, the routing of the gate runner layer 104 and the advantages achieved thereby are essentially the same as in the transistor device 100.

The greater distance between source contact layer 132 and the gate layer 134 allows the SFP 208 to be positioned nearer to the channel region 124 than the SFP 108. This is because the gate bridge 135 may vertically overlap with a portion of the SFP 208 without a significant risk of cross-coupling between the gate metal layer 134 and the source contact layer 132. As such, the first metal layer 130 may be used for forming the SFP 208 and the ASFP 209. In one implementation, for example, the SFP 208 and the ASFP 209 extends from the source contact layer 132. Diverging from the source contact layer 132, the SFP 208 and the ASFP 209 extend along the dimension x of the channel region 124. While the SFP 208 extends over the gate metal layer 134, the ASFP 209 extends away from the gate metal layer 134.

Because the SFP 208 extends from and source contact layer 132, the SFP 208 has the same resistivity as the source contact layer 132, which is typically higher than the second metal layer 140, such as the gate runner layer 104. Moreover, the SFP 208 is substantially coplanar with the source contact layer 132 and the drain contact layer 136. For instance, the SFP 208 and the contact layers 132 and 136 are formed during the same process steps such that they are aligned along the same process plane level with slight shifts introduced by process variations of their respective underlying layers. Along the dimension z, the SFP 208 is positioned in between the gate metal layer 134 and the second metal layer 140, such as the source runner layer 102 and the gate runner layer 104. Moreover, the SFP 208 is separated from the gate metal layer 134, the gate field plate 134a, and the gate runner layer 104 by an insulating layer, which can be the dielectric layer 114. The ASFP 209 shares similar geometric properties as the SFP 208 except that the ASFP 209 extends along a direction opposite to the SFP 208. More specifically, the ASFP 109 extends away from the channel region 124 while the SFP 108 extends to at least partially cover the channel region 124.

By means of routing the gate runner layer 104 away from a region directly above the gate layer 134, the SFP 208 may be placed at a relatively close distance (e.g., less than 5 µm) from the channel region 124. And by extending directly from the source contact layer 132 instead of the source runner layer 102, the SFP 208 is placed even closer to the channel region 124 than the SFP 108 of the transistor device 100. The low placement of the SFP 208 is advantageous for several reasons. First, the low placement allows the SFP 108 to be formed alongside with the source contact layer 132, which reduces the vertical size of the transistor device 100. Second, the low placement of the SFP 108 helps reduce process complexity. Third, the low placement of the SFP 108 maximizes its effectiveness when compared to field plates with higher placements (e.g., metal layers above the first metal layer 130), which is distanced farther away from the channel region 124.

Although the effectiveness of a source field plate may be reduced with its distance from the channel region 124, additional source field plates with greater distance from the channel region 124 may supplement the SFP 108 and the SFP 208. Referring to FIG. 7 for example, a transistor device 300 may include a second source field plate 202 to supplement the SFP 108 and the SFP 208. FIG. 7 illustrates the same cross-section along the first x-z plane as shown in FIGS. 2 and 5 but with reference to the transistor device 300 instead of the transistor devices 100 and 200. The transistor device 300 is similar to the transistor devices 100 and 200 in that these devices include components with the same numeric references. As such, the transistor device 300 has the same structural and functional characteristics as the transistor devices 100 and 200 with respect to these components. For instance, the transistor device 300 incorporates both the SFP 108 and the SFP 208, along with the ASFP 109 and the ASPF 209. In one implementation, the SFP 208 may extend farther towards the drain region 126 than the SFP 108. As such, the SFP 208 may be longer than the SFP 108. Moreover, for routing the gate runner layer 104 away from a region directly above the gate layer 134, the transistor device 300 incorporates the gate bridge 135 with the same configurations as shown and described in FIGS. 2-6.

The second source field plate 202 is a part of a third metal layer 160, which is above the first metal layer 130 and the second metal layer 140. In general, the third metal layer 160 has a resistivity that is lower than the first metal layer 130 and the second metal layer 140. For example, the third metal layer 160 may include a copper (Cu) material. Besides the second source field plate 202, the third metal layer 160 may also include the source terminal conductor 101 and the drain terminal conductor 105. The second source field plate 202 coextends with the source runner layer 102 along the dimension y. Moreover, the second source field plate 202 extends away from the source runner layer 102 and the source contact layer 122 and along the dimension x farther than the source field plate 108.

Consistent with the present disclosure, the term "configured to" purports to describe the structural and functional characteristics of one or more tangible non-transitory components. For example, the term "configured to" can be understood as having a particular configuration that is designed or dedicated for performing a certain function. Within this understanding, a device is "configured to" perform a certain function if such a device includes tangible non-transitory components that can be enabled, activated, or powered to perform that certain function. While the term "configured to" may encompass the notion of being configurable, this term should not be limited to such a narrow definition. Thus, when used for describing a device, the term "configured to" does not require the described device to be configurable at any given point of time.

Moreover, the term "exemplary" is used herein to mean serving as an example, instance, illustration, etc., and not necessarily as advantageous. Also, although the disclosure has been shown and described with respect to one or more implementations, equivalent alterations and modifications will be apparent upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results unless such order is recited in one or more claims. In certain circumstances, multitasking and parallel processing may be advantageous. Moreover, the separation of various system components in the embodiments described above should not be understood as requiring such separation in all embodiments.

What is claimed is:

1. A method of forming an electronic device, comprising:
    forming first and second gate fingers of a gate layer over a top surface of a semiconductor substrate;
    connecting the first gate finger to the second gate finger with first and second gate bridges;
    forming first and second source contact layers over the top surface, between the first and second gate fingers and between the first and second gate bridges; and
    connecting a first source runner layer to the first source contact layer, and a second source runner layer to the second source contact layer.

2. The method as recited in claim 1, further comprising connecting the first gate bridge to the second gate bridge with a gate runner layer.

3. The method as recited in claim 1, further comprising forming a first source field plate that extends from the first source runner layer over the first gate finger, and forming a second source field plate that extends from the second source runner layer over the second gate finger.

4. The method as recited in claim 3, further comprising a forming third source field plate that extends from the source contact layer over the first gate finger and over or under the first source field plate.

5. The method as recited in claim 1, further comprising forming an auxiliary source field plate that extends from the first source runner toward the second source runner.

6. The method as recited in claim 1, further comprising:
    forming a drain contact layer located over the top surface, the first gate finger located between the drain contact layer and the first source contact layer;
    forming a gate dielectric layer over the top surface between the drain contact layer and the first source contact layer; and
    forming a gate field plate connected to the first gate finger and extending over the gate dielectric layer.

7. The method as recited in claim 1, wherein the first and second gate bridges are two of a plurality greater than two of parallel gate bridges connecting the first gate finger and the second gate finger.

8. The method as recited in claim 1, wherein the first and second gate bridges comprise Al or Pb, and the first and second gate fingers comprise Pt or Ag.

9. The method as recited in claim 1, wherein the semiconductor substrate includes a layer comprising gallium and nitrogen contacted by the source contact layers.

10. A method of forming a transistor, comprising:
    forming first and second drain runner layers on a semiconductor substrate having a top surface, and first and second source runner layers between the first and second drain runner layers;
    connecting a first gate layer between the first drain runner layer and the first source runner layer;
    connecting a second gate layer between the second drain runner layer and the second source runner layer; and
    connecting a gate bridge between the first gate layer and the second gate layer.

11. The method as recited in claim 10, wherein the gate bridge is one of a plurality of gate bridges that form a ladder structure with the first and second gate layers.

12. The method as recited in claim 11, further comprising forming a gate runner layer connected to the plurality of gate bridges.

13. The method as recited in claim 10, wherein the gate bridge is a first gate bridge, and further comprising connecting a second gate bridge between the first gate layer and the second gate layer, and forming first and second source contact layers between the first and second gate bridges, the first source contact layer connected to the first source runner layer and the second source contact layer connected to the second source runner layer.

14. The method as recited in claim 10, further comprising connecting a second gate bridge between the first gate layer and the second gate layer, and forming first and second drain contact layers between the first and second gate bridges, the first drain contact layer connected to the first drain runner layer and the second drain contact layer connected to the second drain runner layer.

15. The method as recited in claim 10, further comprising:
    forming a gate dielectric layer over the top surface between the first source runner layer and the first drain runner layer; and
    forming a gate field plate connected to the first gate layer and extending over the gate dielectric layer.

16. The method as recited in claim 10, further comprising connecting a source terminal conductor to the first and second source runner layers, and connecting a drain terminal conductor to the first and second drain runner layers.

17. The method as recited in claim 10, wherein the substrate comprises a gallium aluminum nitride layer over a gallium nitride layer.

18. The method as recited in claim 10, further comprising forming a first source field plate that extends from the first source contact layer toward the first drain runner layer and over the first gate layer.

19. The method as recited in claim 18, further comprising forming a second source field plate that extends from the first source contact layer toward the first drain runner layer and over the first gate layer.

* * * * *